US008107666B2

(12) United States Patent
Smith, III et al.

(10) Patent No.: US 8,107,666 B2
(45) Date of Patent: Jan. 31, 2012

(54) EMBEDDED SOUND BOX

(75) Inventors: Lowell Jack Smith, III, Taoyuan (TW); Chih-Ming Peng, Taoyuan (TW); Hou-Yung Lee, Taoyuan (TW); Hui-Fen Lee, Taoyuan (TW)

(73) Assignee: Meiloon Industrial Co., Ltd., Taoyuan (TW)

(*) Notice: Subject to any disclaimer, the term of this patent is extended or adjusted under 35 U.S.C. 154(b) by 387 days.

(21) Appl. No.: 12/400,412

(22) Filed: Mar. 9, 2009

(65) Prior Publication Data

US 2010/0226521 A1 Sep. 9, 2010

(51) Int. Cl.

| | |
|---|---|
| ***H04R 1/02*** | (2006.01) |
| ***H05K 5/00*** | (2006.01) |
| ***A47B 81/06*** | (2006.01) |
| ***A47H 1/08*** | (2006.01) |

(52) U.S. Cl. ........ 381/386; 381/387; 381/388; 181/150; 181/199; 211/105.6

(58) Field of Classification Search .......... 381/386–388; 181/150, 199; 211/105.6

See application file for complete search history.

(56) References Cited

U.S. PATENT DOCUMENTS

| | | | | |
|---|---|---|---|---|
| 5,749,433 | A * | 5/1998 | Jackson | 181/156 |
| 6,609,589 | B2 * | 8/2003 | Combest | 181/150 |
| 2003/0034199 | A1 * | 2/2003 | Chuang | 181/199 |
| 2003/0123679 | A1 * | 7/2003 | Dudleston et al. | 381/87 |
| 2007/0116304 | A1 * | 5/2007 | Hall et al. | 381/152 |
| 2009/0046875 | A1 * | 2/2009 | Masuda | 381/152 |

* cited by examiner

*Primary Examiner* — Elvin G Enad
*Assistant Examiner* — Ronald Hinson
(74) *Attorney, Agent, or Firm* — Jackson IPG PLLC; Demian K. Jackson

(57) ABSTRACT

The present invention discloses an embedded sound box including a box body and a front panel, and the box body has a fixing plate and at least one spring plate at an end and at least one slide wedge at another end. When the sound box is installed, an end of the fixing plate having the spring plate of the box body is latched into an opening hole, and a slide wedge is retracted towards the interior of the box body, and another end of the fixing plate corresponding to the box body is installed into the opening hole, and finally the slide wedge is protruded out from the box body, such that the box body can be embedded completely into the opening hole, and the front panel is used for covering the opening hole.

14 Claims, 9 Drawing Sheets

EMBEDDED SOUND BOX

BACKGROUND OF THE INVENTION (a) Field of the Invention

The present invention relates to a sound box, in particular to an embedded sound box structure having the features of simple and easy installation and use, convenient repair and maintenance, and aesthetic appearance.

(b) Description of the Related Art

Speaker is an important component for the sound output of an electronic product and acts as a converter for converting an electric signal into a sound signal, and thus speakers are used extensively in various different areas. In a common application, the speaker is integrated with a sound box, so that the sound box can limit the displacement of the speaker and protect the whole speaker assembly. The sound box can also be used for absorbing vibrations of the speaker and amplifying the sound effect by sound reflection paths of the sound box.

With reference to FIG. 1 for a conventional embedded sound box, the embedded sound box includes a box body 11 for accommodating a speaker, a front panel 12 disposed at the front side of the box body 11 for covering an opening of the box body 11, and the front panel 12 having a periphery exceeding the edges of the box body 11, and a plurality of screw through holes 13 disposed at the periphery of the front panel 12.

When the sound box is installed and used, a frame 14 is installed to the embedded sound box first, wherein the frame 14 has a screw hole 15 disposed at the periphery of the frame 14 and corresponding to the screw through hole 13 of the front panel 12, such that after the box body 11 of the embedded sound box is plugged into the frame 14, it is necessary to fix the embedded sound box to a predetermined installation position by securing a plurality of screws 16 one by one into the screw through holes 13 at the front panel 12 and the screw holes 15 at the frame 14.

This structural design not only requires a more complicated installation process, but also makes the repair and maintenance more difficult than the conventional design. In particular, the screw through holes 13 and the screws 16 exposed from the front panel 12 of the embedded sound box give rise to a poor appearance.

SUMMARY OF THE INVENTION

In view of the foregoing shortcomings of the prior art, the present invention provides a speaker structure with the features of simple and easy installation and use, convenient repair and maintenance, and aesthetic appearance.

To achieve the foregoing objective, the present invention provides an embedded sound box comprising a box body and a front panel, wherein a fixing plate is protruded from an end of the box body, a step is formed between the fixing plate and an opening of the box body, and at least one spring plate is installed at the step, and at least one slide wedge is protruded from another end of the box body and disposed corresponding to the spring plate.

The front panel is installed at the front side of the box body for covering the opening of the box body, and the front panel includes at least one sound hole and a groove hole disposed at a position corresponding to a slide wedge and provided for users to retract the slide wedge from the groove hole towards the interior of the box body or extend the slide wedge out from the box body.

When the embedded sound box is installed and used, an end of the fixing plate of the box body having the spring plate is latched into an opening hole, and a slide wedge is retracted towards the interior of the box body, and another end of the fixing plate corresponding to the box body is installed into the opening hole, and finally the slide wedge is slid out from the box body, such that the box body can be embedded completely into the opening hole, and the front panel is provided for covering the opening hole.

When it is necessary to remove the installed box body from the opening hole, users simply slide the slide wedge in a reverse direction. In addition, the front panel has no screws or screw through holes, and thus the sound box has an aesthetic appearance, and the advantages of simple and easy installation and use as well as convenient repair and maintenance.

DETAILED DESCRIPTION OF THE PREFERRED EMBODIMENTS

The present invention will now be described in more detail hereinafter with reference to the accompanying drawings that show various embodiments of the invention as follows.

Figure 1:
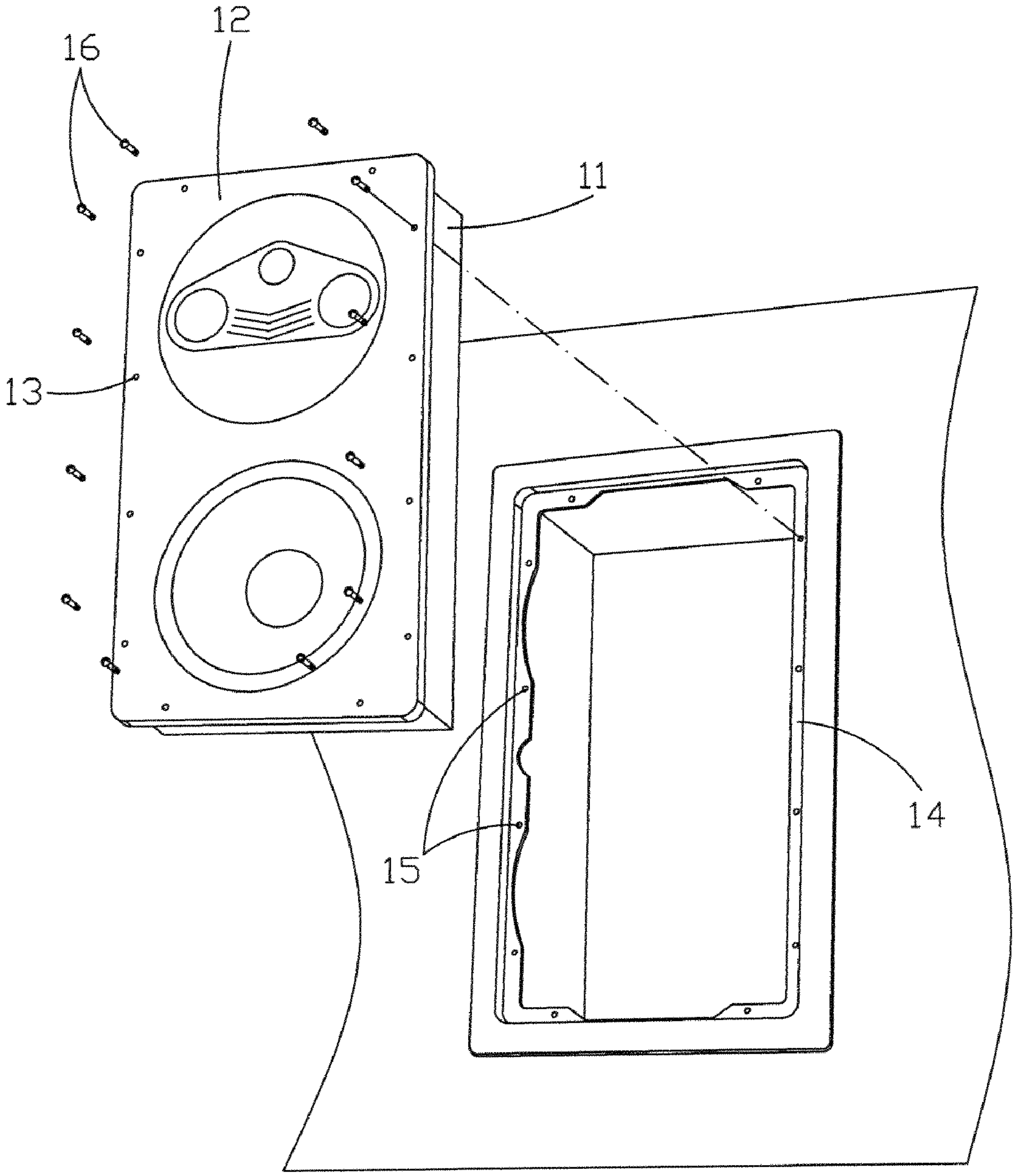
FIG.1 PRIOR ART
FIG. 1 is a schematic view of installing a conventional embedded sound box.
Figure 2:
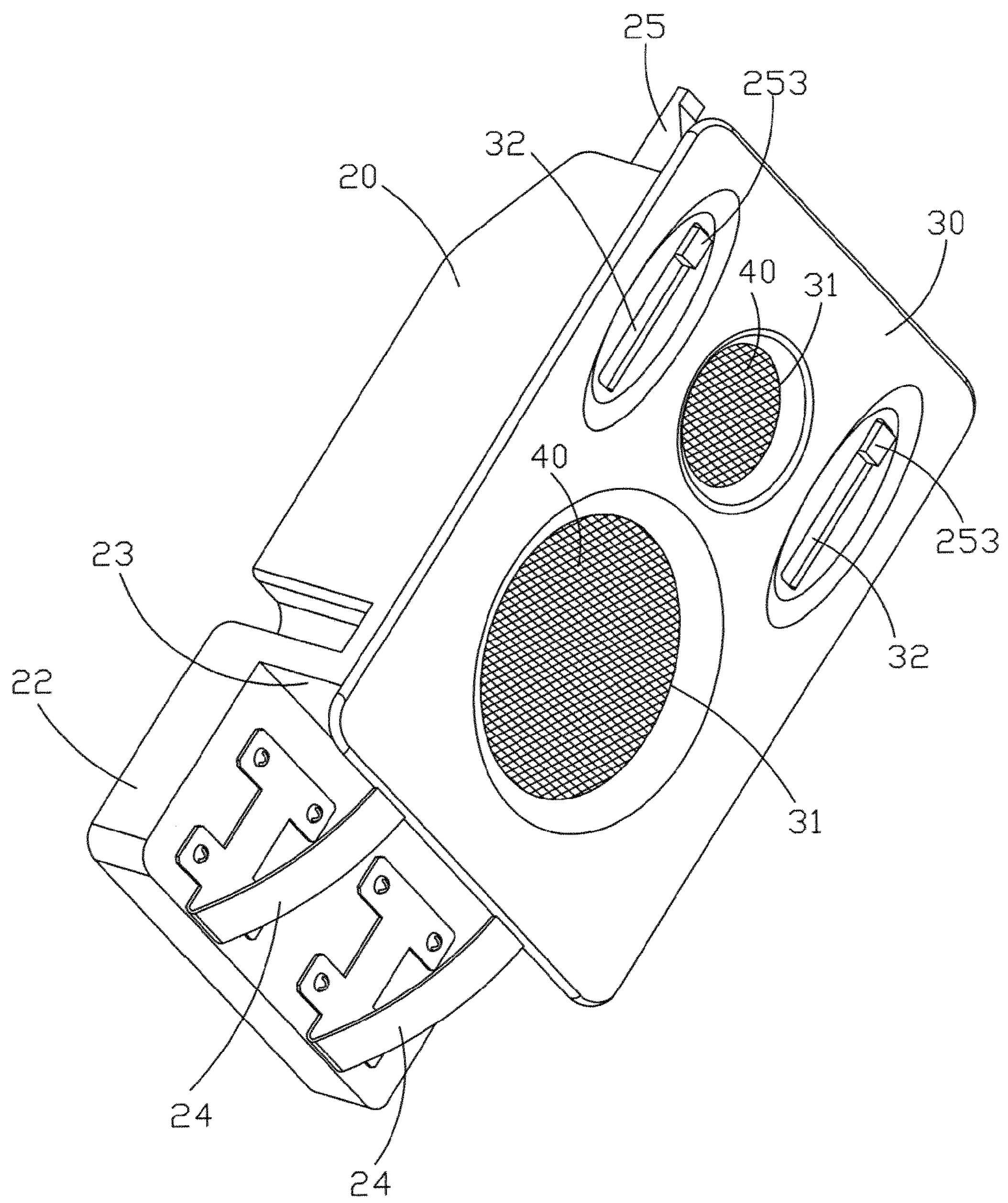
FIG. 2 is a perspective view of an embedded sound box in accordance with a first preferred embodiment of the present invention.
Figure 3:
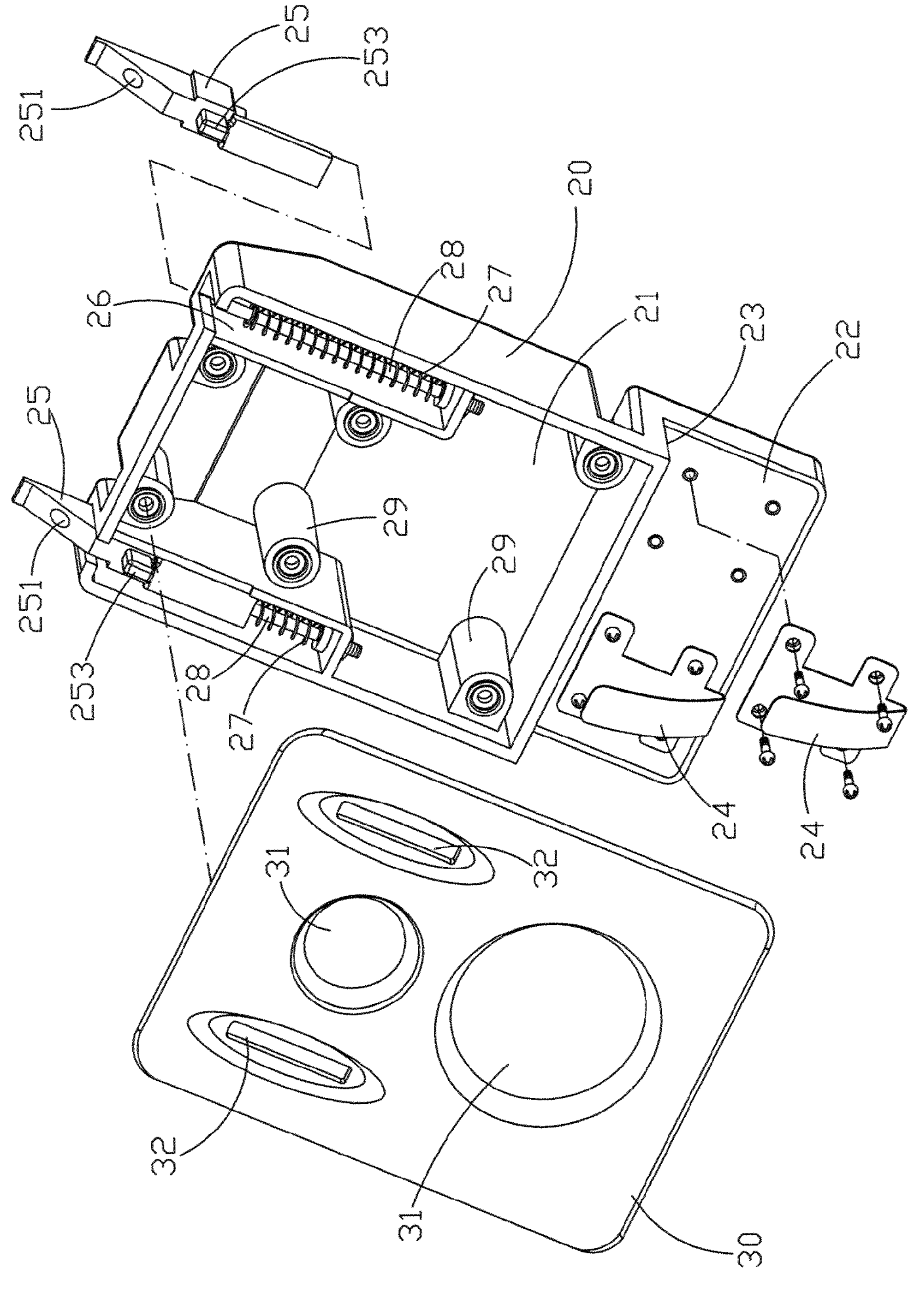
FIG. 3 is an exploded view of an embedded sound box in accordance with a first preferred embodiment of the present invention.

With reference to FIGS. 2 and 3, an embedded sound box of the invention comprises a box body 20 and a front panel 30.

The box body 20 is provided for accommodating a speaker cone 40 and comprises an opening 21 disposed at a front side of the box body 20, a fixing plate 22 protruded from an end (or the bottom) of the box body 20, a step 23 formed between the fixing plate 22 and the opening 21 of the box body 20, at least one spring plate 24 installed at the step 23, and at least one slide wedge 25 protruded from another end (or the top) of the box body 20 and corresponding to the spring plate 24. When use, at least one slide slot 26 disposed at another end of the box body 20 having the fixing plate 22 is provided for installing the slide wedge 25, and the slide slot 26 installs a spring 27, such that the resilience of the spring 27 produces an action force to normally push the slide wedge 25 towards the exterior of the box body 20 or allow the slide wedge 25 to be retracted towards the interior of the box body 20.

Figure 4:
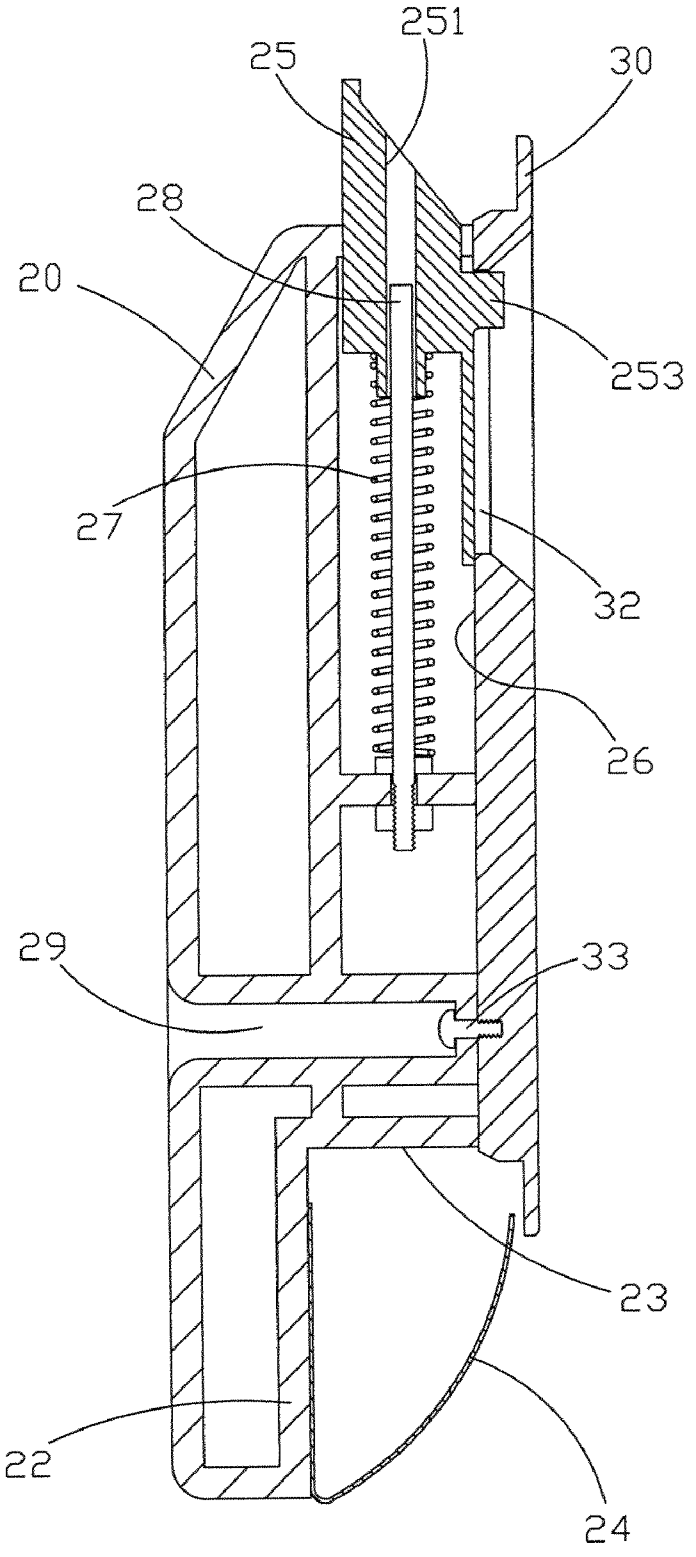
FIG. 4 is a cross-sectional view of an embedded sound box in accordance with a first preferred embodiment of the present invention.
Figure 5:
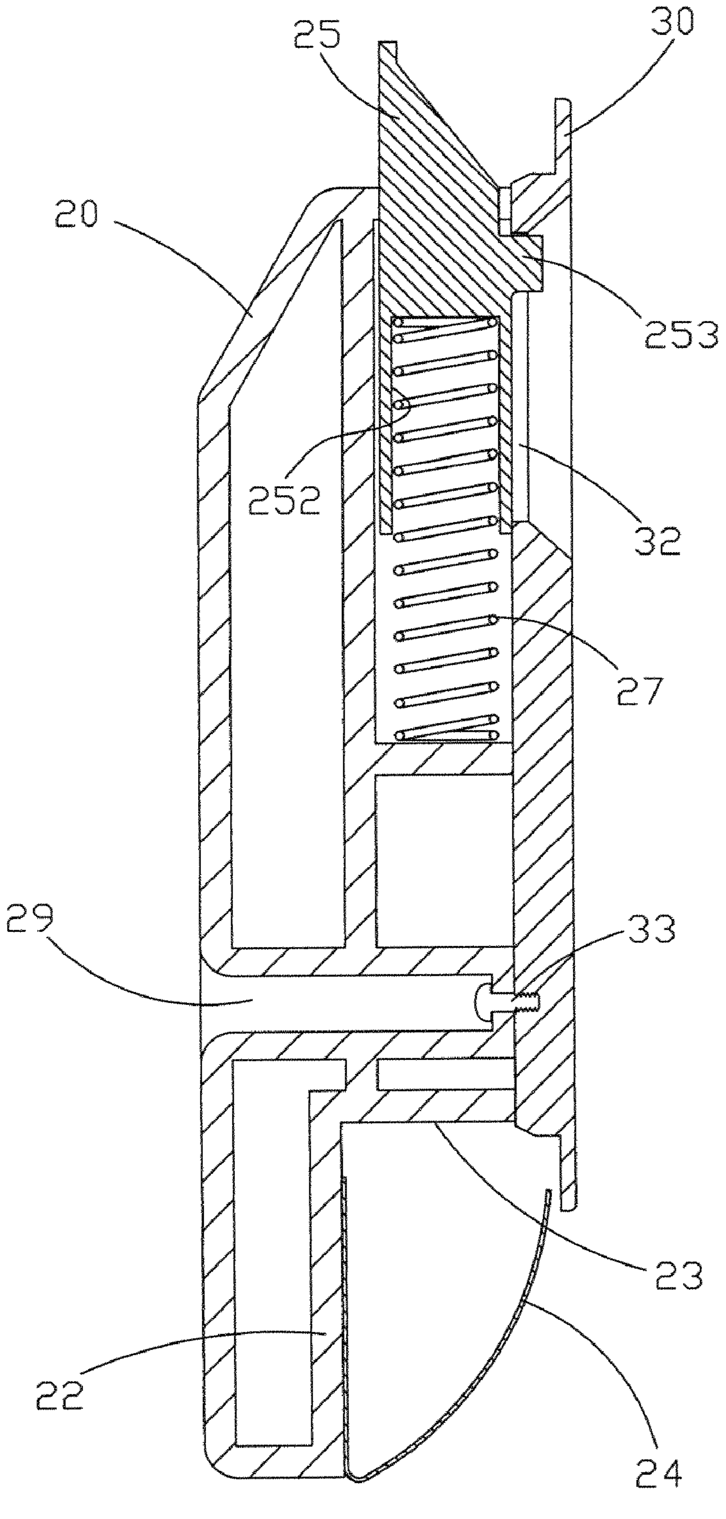
FIG. 5 is a cross-sectional view of an embedded sound box in accordance with a second preferred embodiment of the present invention.

With reference to FIGS. 3 and 4 for a way of selectively extending and contracting the spring 27, a guide rod 28 is installed at the slide slot 26 and passed through the internal periphery of the spring 27, wherein the slide wedge 25 includes a through hole 251 for extending the guide rod 28 therein, and the through hole 251 has a hole diameter slightly greater than a rod diameter of the guide rod 28, so as to produce a support force without affecting the sliding of the slide wedge 25 in the slide slot 26. In FIG. 5, a guide slot 252 is formed at the bottom of the slide wedge 25 for extending the spring 27 therein, and the guide slot 252 has an internal diameter slightly greater than an external diameter of the spring 27, such that if the slide wedge 25 is retracted towards the interior of the box body 20 to compress the spring 27, the spring 27 will enter into the guide slot 252 to obtain a stable support without affecting the sliding of the slide wedge 25 in the slide slot 26.

Figure 6:
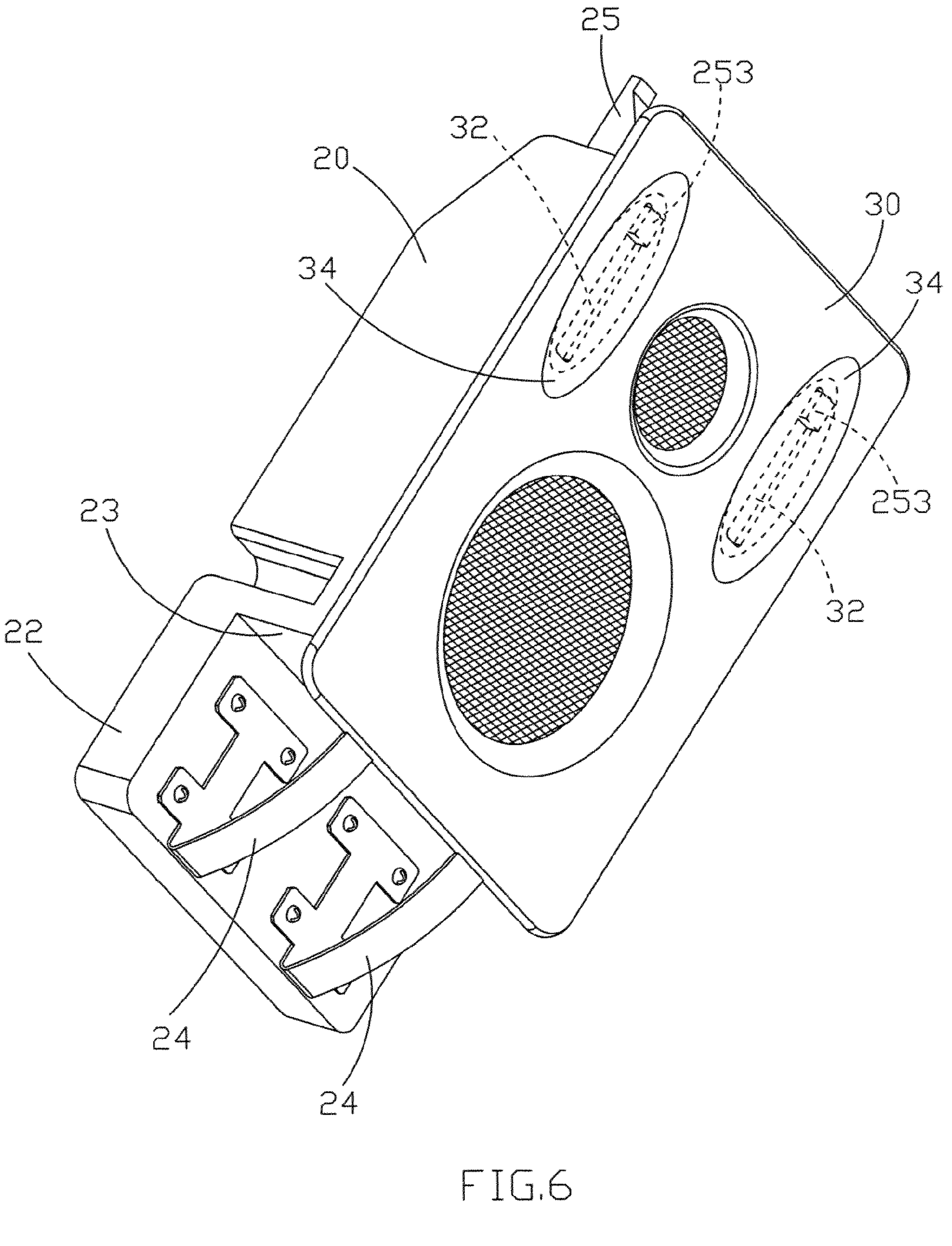
FIG. 6 is a perspective view of an embedded sound box in accordance with a third preferred embodiment of the present invention.

The front panel 30 is installed to the front side of the box body 20 for covering the opening 21 of the box body 20, and the front panel includes at least one sound hole 31 and a groove hole 32 disposed at a position corresponding to the slide wedge 25 of the box body 20 and provided for users to slide the slide wedge 25 from the groove hole 32 towards the interior of the box body 20, or slide the slide wedge 25 out from the box body 20. The slide wedge 25 further includes a protruding plate 253 protruded out from the groove hole 32 to facilitate users to use the protruding plate 253 to slide the slide wedge 25. In FIG. 6, a plug cover 34 is provided for covering the groove hole 32 to prevent children from touching the protruding plate 253 by accident, and such arrangement also gives an aesthetic appearance to the sound box.

Figure 7:
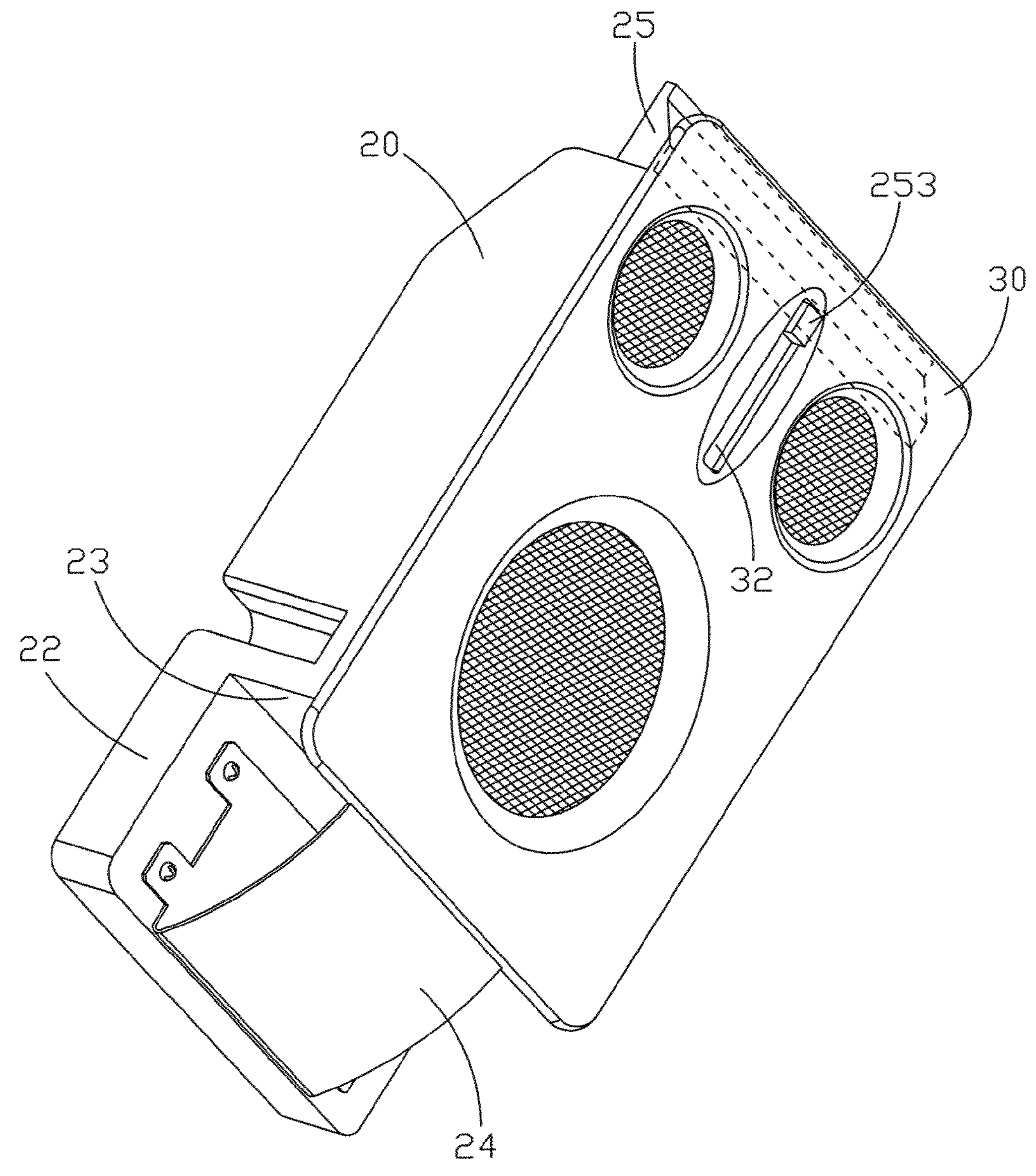
FIG. 7 is a perspective view of an embedded sound box in accordance with a fourth preferred embodiment of the present invention.

When the sound box is used, the box body 20 includes a plurality of screw hole pillars 29 for supporting the front panel 30, and the screw hole pillars 29 are passed through the backside of the box body 20 and secured to the front panel 30 by screws 33, so as to fix the front panel 30 to the front side of the box body 20. The box body 20 installs a plurality of spring plates 24 and slide wedges 25 as shown in FIG. 3 or simply one spring plate 24 and one slide wedge 25 as shown in FIG. 7.

Figure 8:
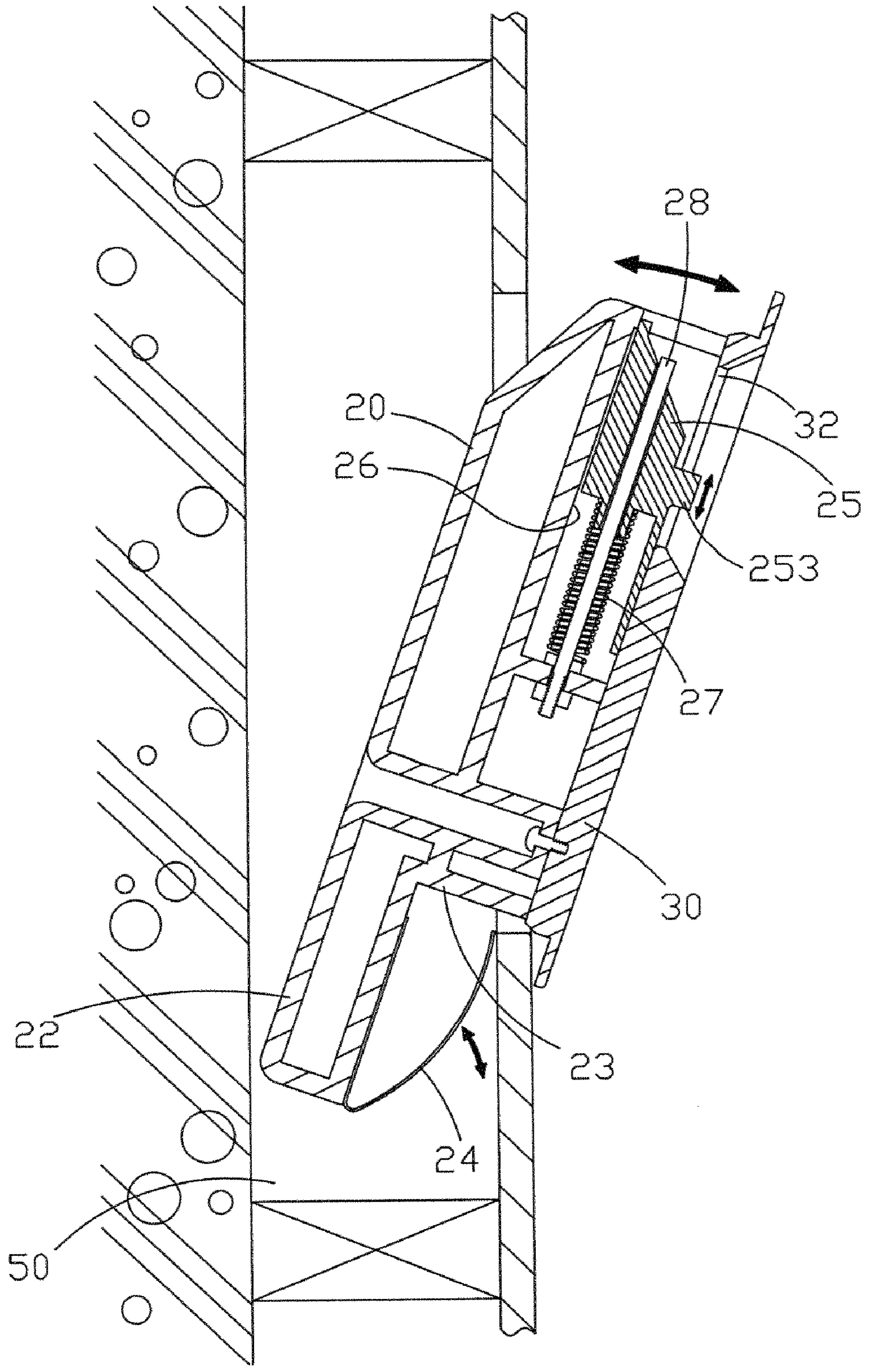
FIG. 8 is a schematic view of installing an embedded sound box of the present invention.
Figure 9:
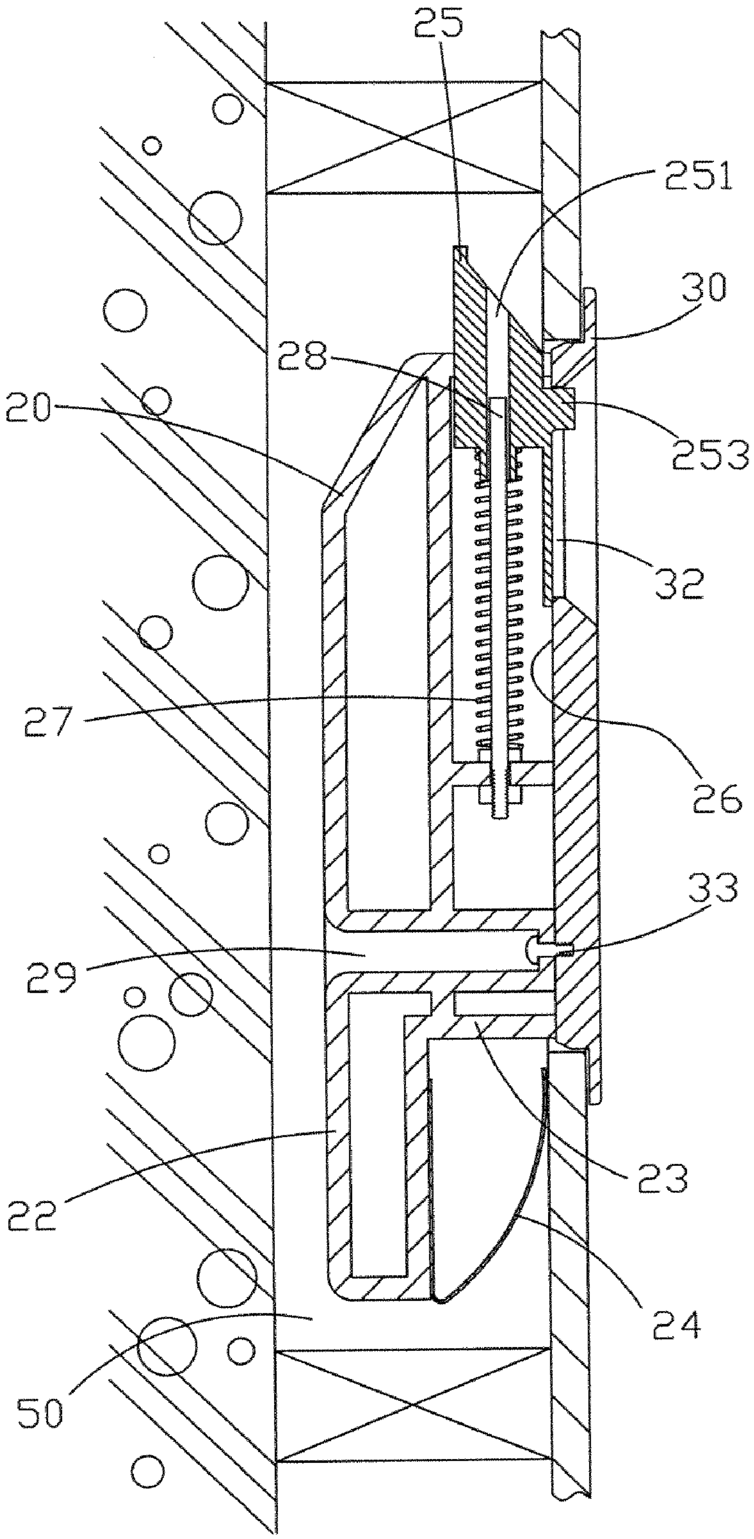
FIG. 9 is a cross-sectional of an installed embedded sound box of the present invention.

With reference to FIGS. 8 and 9 for the installation and use of an embedded sound box in accordance with the present invention, the fixing plate 22 of the box body 20 having the spring plate 24 is latched into an opening hole 50 first, and then the slide wedge 25 is slid and retracted towards the interior of the box body 20 to push another end of the box body 20 corresponding to the spring plate 24 into the opening hole 50, and finally the slide wedge 25 is released to allow the slide wedge 25 to be extended out from the box body 20, such that the spring plate 24 and the slide wedge 25 are latched to the internal sidewall of the opening hole 50 and the box body 20 is embedded completely into the opening hole 50, and the front panel 30 is installed for covering the opening hole 50.

If it is necessary to remove the installed embedded sound box from the opening hole 50, a user simply slides the slide wedge 25 to allow the end of the box body 20 having the slide wedge 25 to be retracted from the opening hole 50, and then removes the box body 20 completely from the opening hole 50, and thus the present invention can achieve the effects of simple and easy installation and use as well as convenient repair and maintenance. In particular, the front panel 30 has no screws or screw through holes when the embedded sound box is installed and used, and thus the invention provides an aesthetic appearance.

In summation of the above description, the present invention herein enhances the performance over the conventional structure and further complies with the patent application requirements and is duly filed for patent application. While the invention has been described by means of specific embodiments, numerous modifications and variations could be made thereto by those skilled in the art without departing from the scope and spirit of the invention set forth in the claims.

We claim:

1. An embedded sound box, comprising:

a box body, for accommodating a speaker cone, and having an opening formed at a front side of the box body, a fixing plate protruded from an end of the box body, a step formed between the fixing plate and the opening of the box body, and having at least one spring plate installed at the step, and at least one slide wedge protruded from another end of the box body and corresponding to the spring plate; and a front panel, installed at a position corresponding to the front side of the box body, for covering the opening of the box body, and the front panel having at least one sound hole.

2. The embedded sound box of claim 1, wherein the box body includes at least one slide slot disposed at another end of the fixing plate for installing at least one slide wedge, and the slide slot includes a spring.

3. The embedded sound box of claim 2, wherein each slide slot includes a guide rod passed into an internal periphery of the spring.

4. The embedded sound box of claim 2, wherein each slide slot includes a guide rod passed into an internal periphery of the spring, and the slide wedge includes a through hole for extending the guide rod therein, and the through hole has a hole diameter slightly greater than a rod diameter of the guide rod.

5. The embedded sound box of claim 2, wherein each slide wedge includes a guide slot for extending the spring, and the guide slot has an internal diameter slightly greater than an external diameter of the spring.

6. The embedded sound box of claim 1, wherein the box body includes a plurality of screw hole pillars disposed therein for supporting the front panel, and the screw hole pillars are passed through the backside of box body and secured to the front panel by a plurality of screws.

7. The embedded sound box of claim 1, further comprising a groove hole disposed at a position corresponding to the slide wedge of the box body, and provided for a user to slide the slide wedge to retract from the groove hole towards the interior of the box body or allow the slide wedge to be extended out from the box body.

8. The embedded sound box of claim 7, wherein each slide wedge includes a protruding plate extended out from the groove hole.

9. The embedded sound box of claim 7, wherein the groove hole is covered by a plug cover.

10. The embedded sound box of claim 7, wherein the box body includes at least one slide slot disposed at another end of the fixing plate for installing at least one slide wedge, and the slide slot installs a spring therein.

11. The embedded sound box of claim 10, wherein each slide slot includes a guide rod passed into an internal periphery of the spring.

12. The embedded sound box of claim 10, wherein each slide slot includes a guide rod passed into an internal periphery of the spring, and the slide wedge includes a through hole for extending the guide rod therein, and the through hole has a hole diameter slightly greater than a rod diameter of the guide rod.

13. The embedded sound box of claim 10, wherein each slide wedge includes a guide slot disposed at the bottom of the slide wedge for extending the spring therein, and the guide slot has an internal diameter slightly greater than an external diameter of the spring.

14. The embedded sound box of claim 7, wherein the box body includes a plurality of screw hole pillars disposed therein for supporting the front panel, and the screw hole pillars are passed through the backside of box body and secured to the front panel by a plurality of screws.

* * * * *